(12) United States Patent
Ahrens et al.

(10) Patent No.: US 7,816,791 B2
(45) Date of Patent: Oct. 19, 2010

(54) BONDING PAD FOR CONTACTING A DEVICE

(75) Inventors: Carsten Ahrens, Pettendorf (DE); Sven Albers, Regensburg (DE); Klaus Gnannt, Stadtbergen (DE); Ulrich Krumbein, Rosenheim (DE); Gunther Mackh, Neumarkt (DE); Patrick Schelauske, Bergkirchen (DE); Berthold Schuderer, Regensburg (DE); Georg Seidemann, Laudshut (DE)

(73) Assignee: Infineon Technologies AG, Neubiberg (DE)

( * ) Notice: Subject to any disclaimer, the term of this patent is extended or adjusted under 35 U.S.C. 154(b) by 437 days.

(21) Appl. No.: 11/854,296

(22) Filed: Sep. 12, 2007

(65) Prior Publication Data

US 2008/0067682 A1 Mar. 20, 2008

(30) Foreign Application Priority Data

Sep. 14, 2006 (DE) ........................ 10 2006 043 133

(51) Int. Cl.
*H01L 23/48* (2006.01)
*H01L 23/52* (2006.01)
(52) U.S. Cl. .................. 257/773; 257/786; 257/E23.02
(58) Field of Classification Search ................. 257/773, 257/786, E23.02
See application file for complete search history.

(56) References Cited

U.S. PATENT DOCUMENTS

| 4,087,314 | A | * | 5/1978 | George et al. ................ 438/614 |
| 5,149,674 | A | * | 9/1992 | Freeman et al. ............. 438/612 |
| 5,502,337 | A | * | 3/1996 | Nozaki ........................ 257/773 |
| 5,886,762 | A | * | 3/1999 | Lee et al. ..................... 349/141 |
| 6,313,537 | B1 | | 11/2001 | Lee et al. |
| 6,960,836 | B2 | | 11/2005 | Bachman et al. |
| 2003/0141593 | A1 | * | 7/2003 | Zuniga-Ortiz et al. ....... 257/750 |
| 2004/0135267 | A1 | | 7/2004 | Akiyama |
| 2005/0001324 | A1 | | 1/2005 | Dunn et al. |
| 2006/0071336 | A1 | * | 4/2006 | Akram ........................ 257/751 |
| 2006/0091536 | A1 | * | 5/2006 | Huang et al. ................. 257/734 |

FOREIGN PATENT DOCUMENTS

| GB | 2406707 A | 4/2005 |
| WO | 03075340 A2 | 9/2003 |

* cited by examiner

*Primary Examiner*—Nitin Parekh
(74) *Attorney, Agent, or Firm*—Slater & Matsil, L.L.P.

(57) ABSTRACT

A bonding pad on a substrate has a first metal structure establishing an electrical connection between a device and a bonding area, and a second metal structure arranged at the bonding area. The first metal structure extends, within the bonding area, at least over part of the bonding area between the substrate and the second metal structure, so as to contact the second metal structure, the second metal structure being harder than the first metal structure.

21 Claims, 5 Drawing Sheets

(5A)

(5B)

BONDING PAD FOR CONTACTING A DEVICE

This application claims priority from German Patent Application No. 10 2006 043 133.2, which was filed on Sep. 14, 2006, and is incorporated herein in its entirety by reference.

TECHNICAL FIELD

An embodiment of the present invention relates to a bonding pad for contacting a device and in particular to a design of a bonding pad for a thick top metal.

BACKGROUND

A bonding pad (or just pad), or a bonding structure, serves to enable electrical contact via a wire contact of an electrical device on a processed wafer, or a chip, for example. A corresponding process is also termed wire bonding, bonding process or simply just bonding. In general, the requirements placed upon the top metal sheet are a high current-carrying capability and a low resistance. In order to meet these requirements, the thickness of the conductor line is crucial, above all, apart from the suitable choice of material. Since the last conductor line plane and the pad are usually realized in the same plane for reasons of cost reduction, the pad metallization also has the thickness necessitated for the conductor lines. If the metallization comprises a soft metal (e.g., Al, AlCu or AlSiCu), difficulties in the bonding on the pad may arise upon exceeding a critical metallization thickness.

Extensive research on wire bonding has shown that passivation cracks develop in the bonding pads, or that a thick top aluminum layer is so soft that it is deformed during wire bonding. In order to avoid this, the force with which a bond wire is welded on the bonding pad would have to be reduced or decreased. However, this has the consequence that no sound connection able to carry a load is achieved between the wire and the bonding pad, and this failure mechanism is called "Non Stick on Pad" (NSOP).

A disadvantage of passivation cracks is a reduced robustness with respect to moisture. In very small housings employed in single wafers such a decrease in quality is unacceptable.

The technical problem thus consists of a lack of a process window for wire bonding on thick layers that can occur when using aluminum and are deformed during the bonding process.

When using gold, this problem does not occur since gold comprises a particularly high current-carrying capability, and thus, correspondingly thinner layer thicknesses may be used for the top metal sheet. However, on 8-inch wafers an Au-lift-off process cannot be fabricated in a stable manner since it is used, among other things, not only for generating the bonding pads but also for hooking up transistor fingers. Thus, not only a coarse structure of the bonding pads has to be generated, but also a fine structuring for terminals of the transistor fingers has to be ensured.

SUMMARY OF THE INVENTION

According to embodiments of the present invention, a bonding pad on a substrate includes a first metal structure establishing an electrical connection between a device and a bonding area, and a second metal structure arranged at the bonding area. The first metal structure extends, within the bonding area, at least over part of the bonding area between the substrate and the second metal structure to contact the second metal structure, the second metal structure being harder than the first metal structure.

According to further embodiments of the present invention, a bonding pad on a substrate includes a first metal structure comprising at least one recess in a bonding area, and a passivation layer covering the first metal structure and comprising an opening at least in the bonding area, and a second metal structure arranged in the bonding area. The first metal structure is arranged within the bonding area between the second metal structure and the substrate such that the passivation layer separates the first metal structure from the second metal structure except for the opening and the first metal structure contacts the second metal structure through the opening. Furthermore, part of the second metal structure extends into the recess, the second metal structure being harder than the first metal structure.

According to further embodiments of the present invention, a bonding pad on a substrate includes a first metal structure, a passivation layer covering the first metal structure and comprising an opening in at least one bonding area, a second metal structure arranged at the bonding area and comprising an electrically conductive protective layer. The first metal structure is arranged within the bonding area between the second metal structure and the substrate, so that the passivation layer separates the first metal structure from the second metal structure except for the opening, and the first metal structure contacts the second metal structure through the opening. The electrically conductive protective layer covers the second metal structure, and the second metal structure is harder than the first metal structure.

According to embodiments of the present invention, a method for producing a bonding pad includes depositing a first metal structure on the substrate, so that an electrical connection is established between a device and a bonding area, and depositing a second metal structure at the bonding area, so that the second metal structure contacts the first metal structure, the second metal structure being harder than the first metal structure.

According to further embodiments of the present invention, a method for producing a bonding pad on a substrate includes depositing a first metal structure comprising at least one recess in a bonding area and establishing an electrical connection between a device and the bonding pad, depositing a passivation layer comprising an opening in at least one bonding area, and depositing a second metal structure at the bonding area, so that the second metal structure contacts the first metal structure through the opening and part of the second metal structure extends into the recess, the second metal structure being harder than the first metal structure.

BRIEF DESCRIPTION OF THE DRAWINGS

Embodiments of the present invention will be detailed subsequently referring to the appended drawings, in which.

Figure 1:
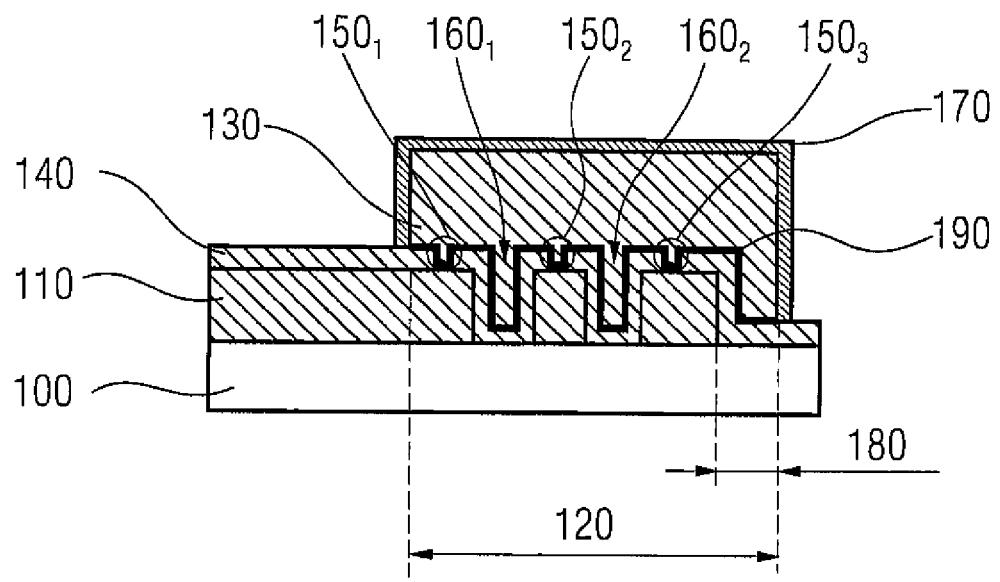
FIG. 1 is a cross-sectional view through a bonding pad with a lateral overhang.

Before embodiments of the present invention will be explained in the following in more detail on the basis of the drawings, it should be understood that the same elements in the figures are provided with the same or similar reference numbers and that a repeated description of these elements is omitted.

DETAILED DESCRIPTION OF ILLUSTRATIVE EMBODIMENTS

For solving technical problems, such as ensuring a wire bonding on a thick top layer (such as aluminum), one could alternatively try to deposit a further metal plane and to generate pads having a thinner aluminum or gold sheet in this additional metal plane. However, a disadvantage would be a highly increased processing expenditure and the problem of yet again having to planarize after the thick metal sheet. Furthermore, a disadvantage of thinner aluminum layers as top metal sheets are reduced current carrying capability and increased layer resistances decreasing the electrical performance of the products.

According to the embodiments of the present invention, the wire bonding is possible if the relatively soft top metal sheet is covered by a hard layer and thus, deformation during wire bonding is inhibited. The hard layer is not deposited over the entire chip but only in one bonding area (pad area). In this process, a force needed during bonding to generate, between the wire and the pad, a sound connection which is able to carry a load is either distributed or drawn off to a stable undersurface (substrate). It is found that a possible rigid plate (hard layer) improves the situation yet does not solve the problem in general. It is better to support a rigid plate on the isolation lying under the metallization, or, as a further possibility, to completely remove the soft top metal sheet in a bonding area. Thus, the bonding area is laterally adjacent to the top metal sheet.

The hard layer may be a copper layer of a thickness of about 4,000 nm, for example, and comprise a so-called electroless NiP/Pd/Au deposition generated in a pattern-plating process. According to the invention a soft pad metallization is thus stabilized by mounting a hard and conductive layer and applying a suitable pad design such that during the further fabrication process, vertical and lateral forces may be accommodated by the chip without damage to the layer system.

An advantage of the embodiments of the present invention is that in comparison to the further metallization plane mentioned above, a corresponding fabrication process is more cost-effective. Beyond the solution to the mechanical problem, the present invention provides the following advantages. On the one hand, the danger of corrosion of bonding pads (made of aluminum, for example) in the event of long sawing using liquid purge (liquid used in sawing) is avoided, such as is already known with 6-inch wafers, for example. Additionally, an incompatibility (such as purple plague) in the connection of gold wires on aluminum surfaces, which particularly occurs at high temperatures, is avoided. Thus, it becomes possible to combine the advantages of a cost-effective thick metallization with the advantages of a mechanical stable pad design.

FIG. 1 shows a cross section through a bonding pad having a side overlapping according to an advantageous embodiment of the present invention. A first metal structure 110 is deposited on a substrate 100, and a second metal structure 130 is deposited in a bonding area 120. In the bonding area 120, the first metal structure 110 comprises two recesses $160_1$ and $160_2$, for example, which at least in part are filled by the second metal structure 130. The first metal structure 110 and the substrate 100 comprise a passivation layer 140 having three openings $150_1, 150_2$ and $150_3$ in the bonding area 120. The second metal structure 130 having a protective layer 170 is deposited on the passivation layer 140 at the bonding area 120 such that the protective layer 170 supports the second metal structure 130 on the side facing away from the substrate 100. In this embodiment, the second metal structure 130 laterally overhangs the first metal structure 110 by an overhang 180 and forms a lateral support to the substrate 100 having the passivation layer 140. It is advantageous to deposit a seed layer 190 onto the bonding area 120 before depositing the second metal structure 130 on the passivation layer 140, so as to support advantageous growth (for example, in view of a defined grating structure), or an adhesion, of the second metal structure 130.

In this context, the first metal structure 110 represents the soft top metal sheet as in the case of a thick aluminum layer, for example, and is, for example, a wiring plane of the chip in which the bonding pad of FIG. 1 is implemented. The second metal structure 130 having the protective layer 170 instead represents the hard layer mentioned above. Both the recesses $160_1$ and $160_2$ and the overhang 180 ensure that a force applied on the bonding pad during wire bonding is drawn off to the substrate 100. Thereby, a deformation of the first metal structure 110, or a crack formation in the passivation layer 140, is prevented. For the recesses $160_1$ and $160_2$ to be able to serve as a support for the second metal structure 130, it is important that they are sufficiently filled with material of the second metal structure 130. Additionally, the overhang 180 comprises a sufficient size such that it can at least in part draw off the force used during bonding. It is further important that the recesses 160 comprise a minimum thickness, for example, of about 2-4 µm for an exemplary minimum pad width of 16 µm.

The openings $150_1, 150_2$ and $150_3$ in the passivation layer 140 serve to enable electrical contact of the second metal structure 130 with the first metal structure 110. Both the passivation layer 140 and the protective layer 170 protect the first metal structure 110 and the second metal structure 130, and, in particular, prevent a corrosion or other undesirable chemical reactions of these two metal structures. Protective layer 170 advantageously comprises a material facilitating the wire bonding at the bonding pads, or avoiding incompatibilities between the materials of the bonding wire and the bonding pad.

Figure 2:
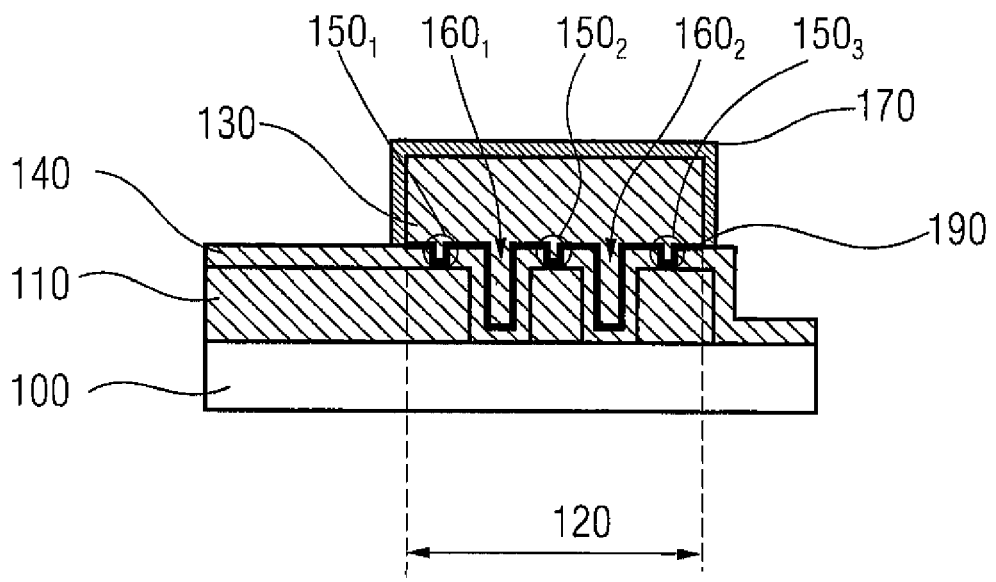
FIG. 2 is a cross-sectional view through a bonding pad without a lateral overhang.

FIG. 2 shows a cross-sectional view through a bonding pad which, in contrast to FIG. 1, does not comprise an overhang 180. As in FIG. 1, however, here, too, the first metal structure 110 having the recesses $160_1$ and $160_2$ in the bonding area 120 is deposited on the substrate 100. The passivation layer 140 protects the first metal structure 110 and is electrically connected to the second metal structure 130 via the openings $150_1, 150_2,$ and $150_3$. In this embodiment, too, the second metal structure 130 is provided with a protective layer 170.

It is apparent that in this embodiment, the bonding area 120 does not laterally overhang the first metal structure 110 and, thus, does not comprise an overhang 180. Due to the lack of the overhang 180 it is important that the passivation layer 140 protects the first metal structure 110 also laterally, and it is further advantageous to deposit a seed layer 190 onto the bonding area 120 before depositing the second metal structure 130 onto the passivation layer 140, so as to again support advantageous growth, or an adhesion, of the second metal structure 130.

Since in this embodiment there is no overhang 180, the force is led, during the bonding, to the substrate 100 exclusively through the recesses $160_1$ and $160_2$ filled with the second metal structure 130. For this purpose, it is important that the recesses $160_1$ and $160_2$ are sufficiently sized, e.g., achieve a minimum width of about 3-4 μm for an exemplary minimum pad width of 16 μm.

In FIGS. 3a-3e, further embodiments of bonding pads are shown, which in comparison to the embodiments of FIG. 1 and FIG. 2 comprise a different width of the recesses $160_1$ and $160_2$, and/or wherein the openings $150_1$, $150_2$, and $150_3$ are configured in a different manner.

Figure 3:
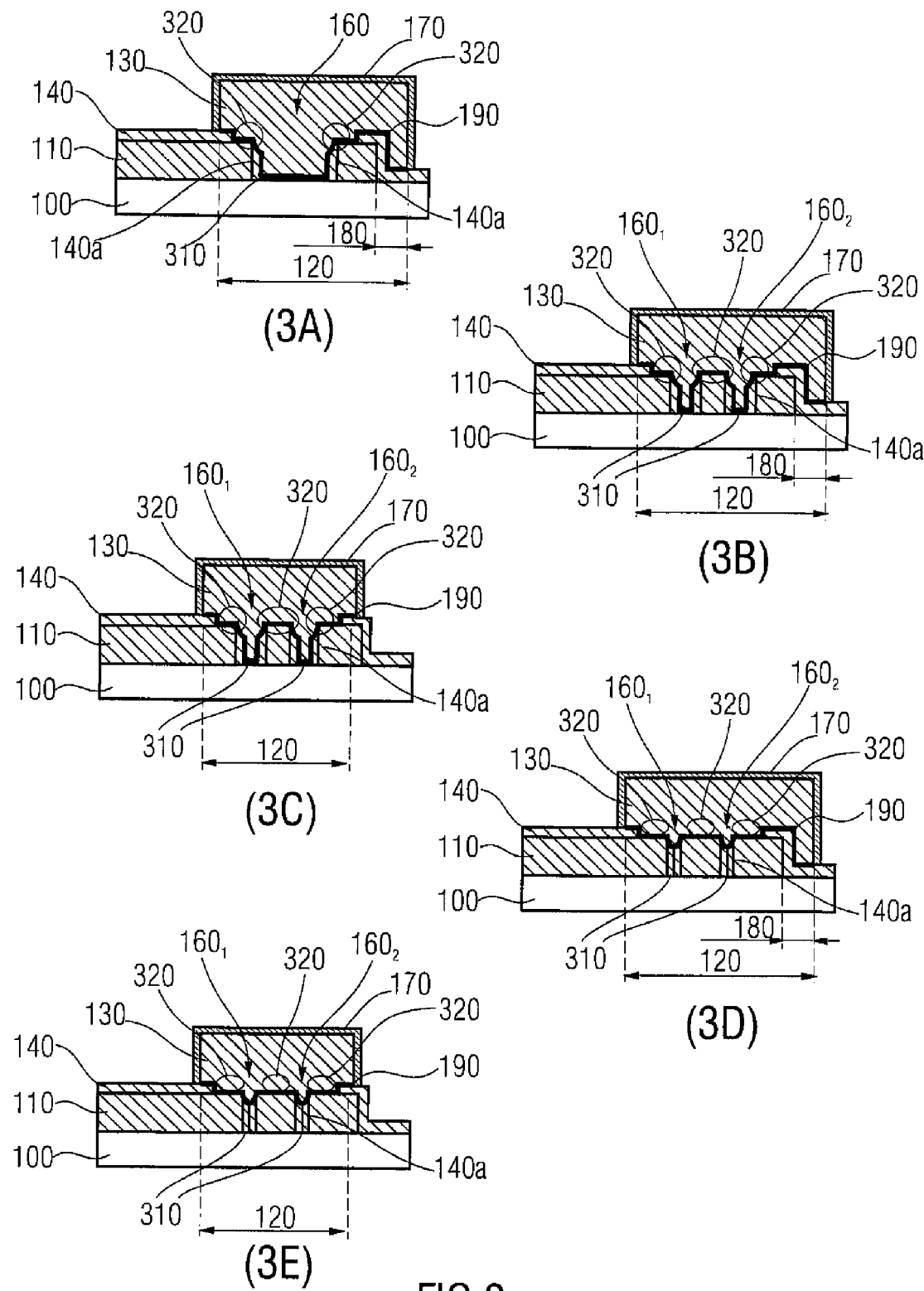
FIGS. 3a to 3e are cross-sectional views of bonding pads having at least one recess in a first metal structure.

FIG. 3a shows an embodiment of a bonding pad comprising a large recess 160, which, however, is wider than both the recesses $160_1$ and $160_2$ of FIG. 1. As in FIG. 1, here, too, the first metal structure 110 having the large recess 160 is deposited on the substrate 100, and both the first metal structure 110 and the substrate 100 comprise the passivation layer 140. The second metal structure 130 having the protective layer 170 is deposited, in the bonding area 120, onto the first metal structure 110 having the large recess 160 such that the protective layer 170 protects the second metal structure 130 at the side facing away from the substrate. In contrast to the embodiment described in FIG. 1, the passivation layer 140 here is removed both at an undersurface 310 and a surface area 120 of the large recess 160, so that a residual passivation layer 140a remains in a wall area of the large recess 160. Additionally, this embodiment also comprises the seed layer 190 serving as a foundation for the second metal structure 130. By analogy with the embodiment of FIG. 1, this embodiment comprises the overhang 180 of the second metal structure 130 over the first metal structure 110. The large recess 160 may comprise a width of about 33 μm, for example.

FIG. 3b shows an embodiment in which, in comparison to the embodiment shown in FIG. 1, the openings 150 are altered as in the embodiment of FIG. 3a. Accordingly, the passivation layer 140 is removed at the undersurface 310 and the surface area 320, and it is only the residual passivation layer 140a that remains in the recesses $160_1$ and $160_2$. Since all further structures correspond to the embodiment of FIG. 1, a repeated description of the structures and the features thereof is omitted here, and reference is made to the explanations concerning FIG. 1.

FIG. 3c shows an embodiment in which, in comparison to the embodiment of FIG. 2, the openings 150 have also been altered such as was described in the embodiment of FIG. 3b. Thus, this embodiment does not comprise an overhang 180, yet the passivation layer 140 is removed both in the recesses $160_1$ and $160_2$ at the undersurface 310 and at the surface area 320, and forms the residual passivation layer 140a in a wall area. As in the embodiment of FIG. 3b, here, too, a repeated description of structures and features already described is omitted (see description concerning FIG. 2).

The embodiments of FIGS. 3b and 3c each comprise two recesses $160_1$ and $160_2$ having a width of about 3-4 μm for example.

In FIGS. 3d and 3e, two embodiments are shown which differ from those shown in FIGS. 3b and 3c only in that the width of the recesses $160_1$ and $160_2$ have been significantly decreased and amount to only 1.5 μm, for example. At the same time, this represents a minimum which still allows practicable fabrication. Similar to the embodiment of FIG. 3b, the embodiment shown in FIG. 3d comprises an overhang 180, whereas the embodiment of FIG. 3e does not comprise an overhang, similar to the embodiment of FIG. 3c. A repeated description of structures and features already described is omitted here, too.

FIGS. 4a-4d show further embodiments of the present invention which do not comprise any recesses $160_1$, and $160_2$ in the first metal structure 110.

Figure 4:
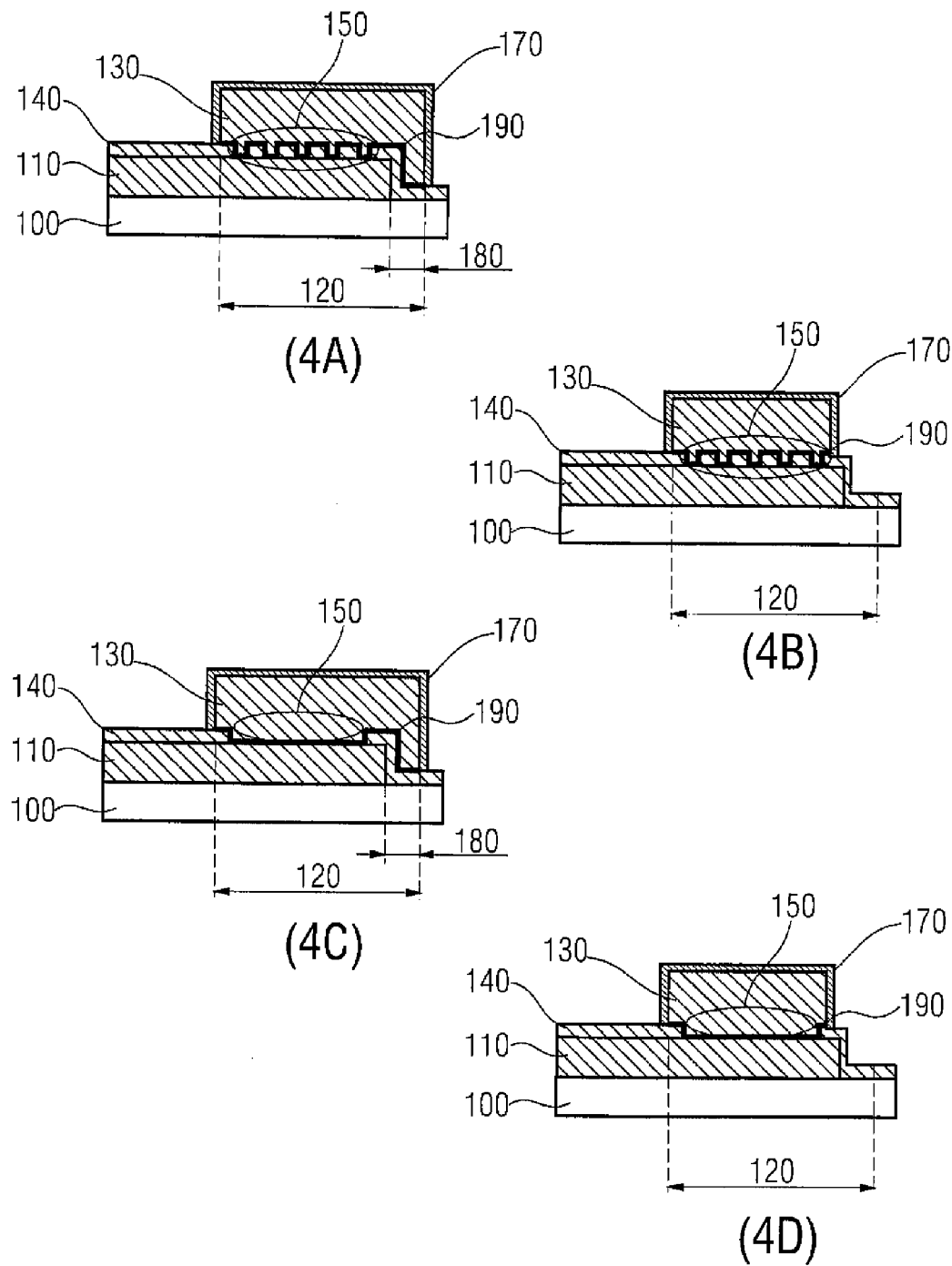
FIGS. 4a to 4d are cross-sectional views of bonding pads not having any recesses in the first metal structure.

FIG. 4a shows an embodiment having an overhang 180 in which the first metal structure 110 is deposited on a substrate 100 and in which both the first metal structure 110 and the substrate 100 comprise the passivation layer 140 having the openings 150 in the bonding area 120. The second metal structure 130 having the protective layer 170 is deposited onto the passivation layer 140 having openings 150 such that the openings 150 are located in the bonding area 120. At the same time, the second metal structure 130 comprises an overhang 180 around which the second metal structure 130 extends laterally over the first metal structure 110 and forms a lateral completion and a lateral support onto the substrate located below. As in the embodiments previously described, this embodiment also comprises a seed layer 190 serves as a foundation for the second metal structure 130.

FIG. 4b shows an embodiment which differs from that of FIG. 4a only in that the second metal structure 130 does not form any overhang 180, that is, the second metal structure 130 ends such that it is laterally substantially flush with the first metal structure 110.

FIG. 4c shows an embodiment which differs from that shown in FIG. 4a only in that the passivation layer 140 has been completely removed in the area of the openings 150. The embodiment of FIG. 4c also comprises an overhang 180, just like the embodiment of FIG. 4a.

In the same way, the embodiment of FIG. 4d differs from the embodiment of FIG. 4b only in that the passivation layer 140 has also been completely removed in the area of the openings 150. In contrast to the embodiment of FIG. 4c, this embodiment does not comprise any overhang 180. A repeated description of structures and features already mentioned is also omitted here.

Figure 5:
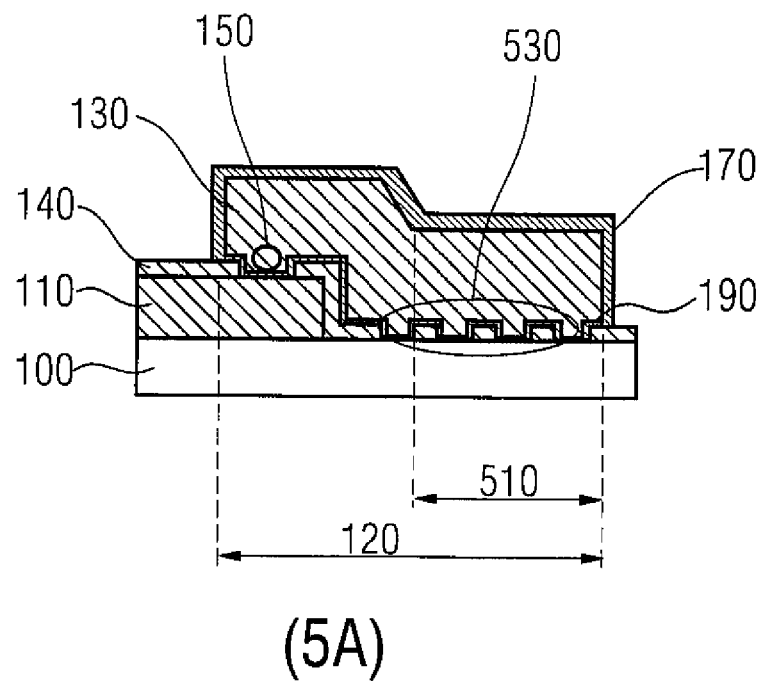
FIGS. 5a and 5b are cross-sectional views of bonding pads having a lateral bonding region and not having any recesses in the first metal structure.
Figure 5:
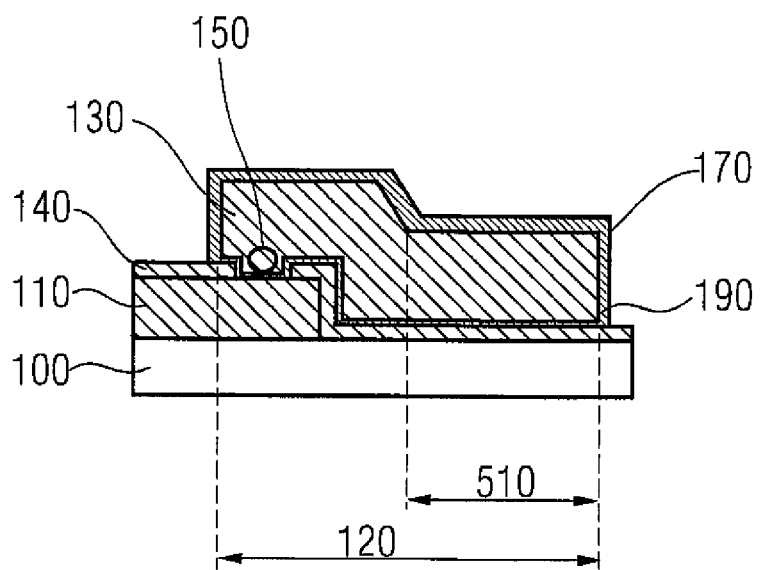

As a substantial difference to all embodiments previously described, the embodiments of FIGS. 5a and 5b comprise a lateral shift of the bonding area 120. Thus, a bonding region 510 intended for bonding results laterally adjacent to the first metal structure 110 as part of the bonding area 120. Since the first metal structure 110 represents a soft layer sheet, it is advantageous if there is no first metal structure 110 in the bonding region 510. Thus, the force used in the bonding may be directly drawn off to the substrate 100.

In FIG. 5a, an embodiment is shown in which a first metal structure 110 is deposited on the substrate 100, both the first metal structure 110 and the substrate 100 comprising the passivation layer 140. The second metal structure 130 is deposited in the bonding area 120, the bonding area 120 partly involving the first metal structure and the laterally shifted bonding region 510. The second metal structure 130 comprises a protective layer 170 as a completion and, again, the seed layer 190 as a foundation. In the area between the first metal structure 110 and the second metal structure 130, the passivation layer 140 comprises an opening 150, and between the second metal structure 130 and the substrate 100, it comprises openings 530. In this context, the opening 150 serves to enable electrical contact of the first metal structure 110 and the second metal structure 130. In this embodiment, the bonding region 510 as part of the bonding area 120 is located laterally adjacent to the first metal structure 110 and is substantially located above the openings 530.

FIG. 5b shows an embodiment which differs from that shown in FIG. 5a only in that the passivation layer 140 does not comprise any openings 530 in the area 530, and a repeated description of structures and features already mentioned is also omitted here.

Figure 6:
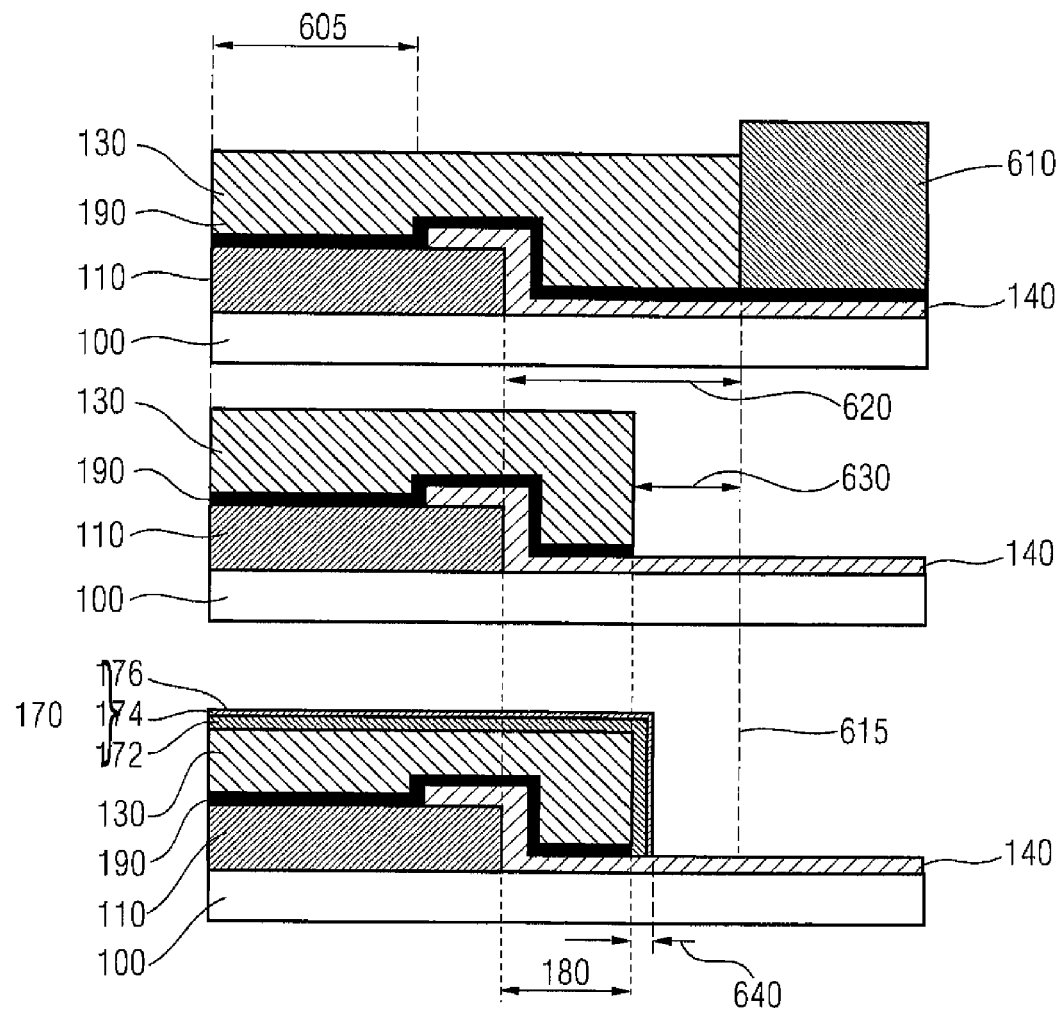
FIG. 6 is a schematic process flow for producing a bonding pad with a lateral overhang.

FIG. 6 shows a schematic process flow for producing a bonding pad having an overhang 180. The cross-sectional views do not include the entire bonding area 120 but only a marginal area of the first metal structure 110. In the process flow, the first metal structure 110 and subsequently the passivation layer 140 are deposited onto the substrate 100. The passivation layer 140 serves as a protection for both the first metal structure 110 and the substrate 100, that is, the passivation layer 140 also extends to a substrate region not covered by the first metal structure 110.

The passivation layer 140 is removed from the first metal structure 110 in an area of an opening 605, and subsequently, a seed layer 190 is deposited onto the opening 605 and the passivation layer 140. In the following step, the second metal structure 130 is generated onto the seed layer 190, a sacrificial layer 610 marking an outer boundary 615. The sacrificial layer 610 fixes a lateral overhang 620 for the second metal structure 130 over the first metal structure 110. After generating the second metal structure 130, the sacrificial layer 610 and a part 630 of the lateral overhang 620 are removed. In this step, the seed layer 190 is removed at the same time in the part 630. This process step may comprise a wet etching process, for example.

In a last step, the protective layer 170 is deposited on the second metal structure 130. The protective layer 170 may have a sequence of layers comprising a first layer 172, a second layer 174 and a third layer 176, for example. Exemplary materials are NiP (nickel/phosphorus) for the first layer 172, Pd (palladium) for the second layer 174, and Au (gold) for the third layer 176, having a layer thickness 640 of 1.3 µm, for example, for the protective layer 170. Additionally, the lateral overhang 620 comprises a width of 6 µm, for example, and the part 630 comprises a width of 2-4 µm, for example. The layer materials mentioned are only examples, and in further embodiments, other materials or other layer thicknesses may be used, the choice being advantageously made such that the materials are as compatible as possible with each other and guarantee good adhesion.

For example, aluminum, or an aluminum compound, may be considered possible materials for the first metal structure 110, and the second metal structure 130 comprises copper, for example. The seed layer 190 may comprise TiW (titanium/wolfram), for example, and the second metal structure 130 may be generated on the seed layer 190 by a pattern-plating process. The protective layer 170 may be generated by a so-called electroless deposition, for example, and comprise the materials mentioned above (NiP/Pd/Au).

Examples of possible layer thicknesses may be indicated as follows. The first metal structure 110 comprising AlCu, for example, may comprise an exemplary layer thickness of about 3.2 µm, and the second metal structure 130 may comprise a layer thickness of about advantageously 4 µm, and the passivation layer 140 may comprise a layer thickness of 0.9-1.4 µm (advantageously 300 nm plasma oxide and 800 nm plasma nitride). The bonding pad may comprise a size of about 65 µm, for example, and for the overhang 180, a lower limit of about 2 µm, for example, may be indicated, and a minimum width of the bonding pad is about 16 µm, for example. The recesses $160_1$ and $160_2$ may comprise a minimum extension within the range of 1.3-4 µm, for example. The embodiments of FIGS. 3d and 3e comprise the minimum size of about 1.5 µm for the recesses $160_1$, and $160_2$, and the embodiments of FIG. 1, FIG. 2, FIG. 3b and FIG. 3c comprise an exemplary extension of about 3-4 µm for the recesses $160_1$, and $160_2$. The embodiment of FIG. 3a, however, comprises a significantly larger recess 160 which may be 33 µm, for example.

Further embodiments may contain still further recesses $160_1$ and $160_2$, or a combination of the embodiments described. Yet not only the number but also the sizes of the recesses $160_1$ and $160_2$ and/or the openings $150_1$, $150_2$, and $150_3$ can be varied.

An advantage of the embodiments of FIGS. 4a, 4b, 4c and 4d is that they comprise a low resistance and, beyond that, show low electromigration. The embodiments of FIGS. 5a and 5b are advantageous in that there is no first metal structure 110 in the bonding region 510 and accordingly, the hardness necessitated for the wire bonding may be ensured by the second metal structure 130, and the first metal structure 110 is not affected. In general, all embodiments comprising an overhang 180, i.e., the embodiments of FIG. 1, FIG. 3a, FIG. 3b, FIG. 3d, FIG. 4a, FIG. 4c, FIG. 5a and FIG. 5b, show a higher mechanical stability since part of the pressure is drawn off laterally at the first metal structure 110.

The design of the three layers substantially involved (hard layer or second metal structure 130, soft metallization or first metal structure 110, passivation or passivation layer 140) leads to several useful variants which correspond to the embodiments described in the FIGS. and may be combined with one another.

With respect to the size ratio of the soft metallization (first metal structure 110) and the hard layer (second metal structure 130):

in the bonding area 120, the first metal structure 110 is larger than the second metal structure 130 (as in FIG. 2, for example);

in the bonding area 120, the first metal structure 110 is smaller than the second metal structure 130 (as in FIG. 1, for example);

in the bonding area 120, the first metal structure 110 is completely left out (as in FIG. 5a, for example).

With respect to the structuring of the passivation layer 140 in the bonding area 120:

continuously open (as in FIG. 4c, for example);

open only in certain areas, for example in a grating-shaped, or screen-shaped, structure (as in FIG. 4a, for example).

With respect to the structuring of the first metal structure 110:

not discontinued (i.e. no recesses $160_1$ and $160_2$ as in FIG. 4a, for example);

discontinued by holes (i.e. having recesses $160_1$ and $160_2$ as in FIG. 1, for example).

An advantageous embodiment may be summarized as follows.

As a top metallization sheet (first metal structure 110), AlCu is used, for example, in a layer thickness of 3.2 µm. It may be structured in different variants (see FIGS.) and advantageously comprises holes (or recesses $160_1$, and $160_2$) of 3-4 µm in size.

Subsequently, a passivation layer 140 advantageously comprising 300 nm plasma oxide and 800 nm plasma nitride is deposited. The passivation layer 140 is structured according to the variants shown and is advantageously provided with holes (or openings $150_1$, $150_2$, and $150_3$) of 3-4 µm in size where the top metallization layer (first metal structure 110) has come to a stop in the bonding area 120.

Subsequently, a seed layer (seed layer 190), for example, is deposited which advantageously comprises TiW and is structured such that the hard layer (second metal structure 130) may be subsequently grown according to the variants described using the FIGS. and is advantageously larger than the first metal structure 110 (i.e., of the AlCu layer, for example) in the bonding area 120.

Subsequently, the second metal structure 130 (comprising a copper layer, for example) is grown in a so-called pattern-plating process, for example. An advantageous layer thickness is about 4 μm.

Subsequently, three metal sheets are deposited in an electroless galvanic process as protective layer 170 on the second metal structure 130 comprising a copper layer, for example. The protective layer 170 may comprise the following materials, for example: NiP (first layer 172), followed by Pd (second layer 174) and an Au layer (third layer 176), the Au layer serving for passivation. Advantageous layer thicknesses of the three layers are between 50 nm and 800 nm.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

What is claimed is:

1. A bonding pad on a substrate, comprising:
   a first metal structure establishing an electrical connection between a device and a bonding area; and
   a second metal structure arranged at the bonding area,
   wherein the first metal structure extends, within the bonding area, at least over part of the bonding area between the substrate and the second metal structure to contact the second metal structure, the second metal structure being harder than the first metal structure, and
   wherein at least a portion of the first metal structure extends from the substrate by a first distance and wherein at least two portions of the second metal structure are spaced from the substrate by a distance less than the first distance.

2. The bonding pad according to claim 1, further comprising a passivation layer covering the first metal structure and comprising, at least in the bonding area, an opening through which the first metal structure and the second metal structure are connected.

3. The bonding pad according to claim 2, wherein the passivation layer comprises further openings.

4. The bonding pad according to claim 1, further comprising an electrically conductive protective layer covering the second metal structure.

5. The bonding pad according to claim 4, wherein the electrically conductive protective layer includes a sequence of layers comprising a gold layer.

6. The bonding pad according to claim 1, wherein the bonding area comprises a bonding region, the bonding region being arranged laterally adjacent to the first metal structure and serving for electrically contacting the bonding area.

7. The bonding pad according to claim 1, wherein the first metal structure comprises aluminum, and the second metal structure comprises copper.

8. A bonding pad on a substrate, comprising:
   a first metal structure comprising at least one recess in a bonding area so that portions of the first metal structure extend from the substrate by a first distance;
   a passivation layer covering the first metal structure and comprising an opening in at least the bonding area; and
   a second metal structure arranged in the bonding area such that the first metal structure is arranged within the bonding area between the second metal structure and the substrate, so that the passivation layer separates the first metal structure from the second metal structure except for at the opening, and the first metal structure contacts the second metal structure through the opening, and so that portions of the second metal structure extend into the recess and are spaced from the substrate by a distance less than the first distance, the second metal structure being harder than the first metal structure.

9. The bonding pad according to claim 8, wherein the first metal structure establishes an electrical connection to a device.

10. The bonding pad according to claim 8, further comprising an electrically conductive protective layer covering the second metal structure.

11. The bonding pad according to claim 8, further comprising a seed layer limiting the second metal structure on the side facing the substrate.

12. The bonding pad according to claim 8, wherein the passivation layer comprises further openings.

13. The bonding pad according to claim 8, wherein the second metal structure laterally at least partly encloses the first metal structure.

14. A bonding pad on a substrate, comprising:
   a first metal structure;
   a passivation layer covering the first metal structure and comprising an opening in at least one bonding area;
   a second metal structure arranged at the bonding area; and
   an electrically conductive protective layer, the first metal structure being arranged within the bonding area between the second metal structure and the substrate, so that the passivation layer separates the first metal structure from the second metal structure except for the opening, and the first metal structure contacts the second metal structure through the opening, and the electrically conductive protective layer covering the second metal structure, and the second metal structure being harder than the first metal structure,
   wherein at least a portion of the first metal structure extends from the substrate by a first distance and wherein at least two portions of the second metal structure are spaced from the substrate by a distance less than the first distance.

15. The bonding pad according to claim 14, wherein the electrically conductive protective layer includes a gold layer.

16. The bonding pad according to claim 15, wherein the electrically conductive protective layer comprises a sequence of layers including nickel, phosphorus, palladium and gold.

17. The bonding pad according to claim 14, wherein the second metal structure comprises copper.

18. The bonding pad according to claim 14, wherein the first metal structure comprises aluminum.

19. The bonding pad according to claim 14, wherein the first metal structure comprises a layer thickness larger than 0.5 μm.

20. The bonding pad according to claim 1, wherein the portion of the second metal structure spaced from the substrate by a distance less than the first distance comprise at least one portion extending into at least one recess formed in the first metal structure and one portion laterally overhanging the first metal structure.

21. The bonding pad according to claim 1, wherein the second metal part comprises a plurality of portions spaced from the substrate by a distance less than the first distance, which extend into a plurality of recesses formed in the first metal structure.

* * * * *